(12) United States Patent
Dullien et al.

(10) Patent No.: US 11,990,923 B1
(45) Date of Patent: May 21, 2024

(54) SELECTING DATA COMPRESSION PARAMETERS USING A COST MODEL

(71) Applicant: Elasticsearch B.V., Amsterdam (NL)

(72) Inventors: Thomas Dullien, Zurich (CH); Sean Heelan, Oxford (GB)

(73) Assignee: Elasticsearch B.V., Amsterdam (NL)

( * ) Notice: Subject to any disclaimer, the term of this patent is extended or adjusted under 35 U.S.C. 154(b) by 459 days.

(21) Appl. No.: 17/192,720

(22) Filed: Mar. 4, 2021

Related U.S. Application Data

(60) Provisional application No. 62/984,945, filed on Mar. 4, 2020.

(51) Int. Cl.
*H03M 7/30* (2006.01)
*G06F 11/30* (2006.01)
*G06F 11/34* (2006.01)

(52) U.S. Cl.
CPC ....... *H03M 7/6064* (2013.01); *G06F 11/3024* (2013.01); *G06F 11/34* (2013.01); *H03M 7/3062* (2013.01)

(58) Field of Classification Search
CPC .......................... H03M 7/6064; H03M 7/3062
USPC .......................................... 341/50, 63, 51, 67
See application file for complete search history.

(56) References Cited

U.S. PATENT DOCUMENTS

| | | | |
|---|---|---|---|
| 9,385,749 B1 * | 7/2016 | Nam | H03M 7/607 |
| 2013/0088373 A1 * | 4/2013 | Takano | H03M 7/6047 |
| | | | 341/87 |
| 2018/0131749 A1 * | 5/2018 | Dobrenko | H04L 69/04 |
| 2019/0007493 A1 | 1/2019 | Gray et al. | |
| 2019/0215519 A1 * | 7/2019 | Huang | H04N 19/152 |
| 2020/0133866 A1 * | 4/2020 | Das | H03M 7/30 |

OTHER PUBLICATIONS

Frederickson, Ben "Profiling Native Python Extensions", Sep. 27, 2019, pp. 1-4.
"GDB Utilities for HHVM", retrieved from https://github.com/facebook/hhvm/tree/master/hphp/tools/gdb on Jun. 23, 2021.

(Continued)

*Primary Examiner* — Peguy Jean Pierre
(74) *Attorney, Agent, or Firm* — Quinn IP Law

(57) ABSTRACT

In various embodiments, the system and method described herein provide functionality for selecting an appropriate compression algorithm and settings given a cost model. Specifically, in selecting a compression method and configuration, the described system and method use a cost model to take into account the financial cost of a number of aspects of a particular compression scenario, including, but not limited to, the cost of performing the compression/decompression and the cost of storing the data. In this manner, intelligent trade-offs can be made between CPU/computing cost and data storage/transmission cost in an environment where a dollar amount can be associated with CPU processing time and storage/transmission volume. The described system and method can make such decisions dynamically, so that compression and/or decompression operations can respond to changing conditions on the fly, thus leading to better and more cost-effective management of resources.

36 Claims, 10 Drawing Sheets

(56) References Cited

OTHER PUBLICATIONS

Bastian, Theophile et al., "Reliable and Fast DWARF-Based Stack Unwinding", Proceedings of the ACM on Programming Languages, ACM, 2019, pp. 1-25.
Nardelli, Francesco "Tales from Binary Formats", Jan. 26, 2018, pp. 1-133.
"[Patch 7/7] DWARF: add the config option", retrieved from https://lwn.net/Articles/728347/ on Jun. 23, 2021.
Talbot, David et al., "Bloom maps", Oct. 29, 2018, pp. 1-15.
Porat, Ely "An Optimal Bloom Filter Replacement Based on Matrix Solving", Apr. 11, 2008, pp. 1-13.
Putze, Felix et al., "Cache-, Hash- and Space-Efficient Bloom Filters", 2007, pp. 1-14.

* cited by examiner

SELECTING DATA COMPRESSION PARAMETERS USING A COST MODEL

CROSS-REFERENCE TO RELATED APPLICATION

The present application claims the benefit of U.S. Provisional Application Ser. No. 62/984,945 for "Selecting Data Compression Parameters Using a Cost Model" filed on Mar. 4, 2020, which is incorporated by reference herein in its entirety.

TECHNICAL FIELD

The present document relates to techniques for selecting parameters for data compression.

BACKGROUND

Many existing systems provide video compression functionality; these include codecs, compressing WAN accelerators, appliances for performing specialized compression, and/or the like. They can be implemented in software, hardware, firmware, and/or any combination thereof.

In general, for most compression algorithms, it is usually possible to perform more powerful or effective compression if one is willing to spend more computational effort on the compression itself, either by choosing a more computationally expensive algorithm, or by adjusting parameters for an algorithm accordingly. Thus, there is usually a tradeoff between compression power and computational cost.

Historically, computational cost was not usually measured in dollars. Throughput/latency requirements were often expressed in terms of data volume, rather than being expressed in terms of a dollar-based cost. Rather, compression was usually performed to the maximum of the available CPU power in the device that was allocated to compression.

The advent of cloud computing has changed this: cloud vendors charge for CPU usage with a per-second resolution, and it is possible to reasonably precisely determine how much CPU time costs. Furthermore, many cloud vendors have "spot markets" for CPU time. Thus, in many situations, the optimal compression algorithms and settings can change depending on the overall current spot price of computing. However, existing systems generally fail to take such factors into account when determining which of several compression algorithms to use, or when configuring or setting parameters for compression.

Existing WAN optimization technologies offer traffic compression for wide-area networks. Historically, such approaches involve physical and/or virtual appliances that seek to reduce network traffic by applying compression algorithms and deduplication. However, such systems do not provide any mechanisms for taking computational cost into account when making decisions as to when to apply more computational effort to achieve better compression and when not to do so.

SUMMARY

In various embodiments, the system and method described herein provide functionality for selecting an appropriate compression algorithm and settings given a cost model. Specifically, in selecting a compression method and configuration, the described system and method use a cost model to take into account the financial cost of a number of aspects of a particular compression scenario, including, but not limited to, the cost of performing the compression/decompression and the cost of storing the data.

The cost model can take into account variables such as the cost of CPU time, amount of data to be compressed, necessary "CPU headroom" for availability and latency, frequency of access of that data, and the like. In this manner, the described system and method are able to take into account changing prices, load, and other factors, in making decisions as to how compression should be performed.

The described system and method are therefore able to make intelligent trade-offs between CPU/computing cost and data storage/transmission cost in an environment where a dollar amount can be associated with CPU processing time and storage/transmission volume. This trade-off may involve choosing to perform more computation whenever such an approach might yield savings elsewhere in the stack, and reducing or stopping compression and/or decompression operations when CPU resources are scarce or expensive. The described system and method can make such decisions dynamically, so that compression and/or decompression operations can respond to changing conditions on the fly, thus leading to better and more cost-effective management of resources.

Further details and variations are described herein.

BRIEF DESCRIPTION OF THE DRAWINGS

The accompanying drawings, together with the description provided below, illustrate several embodiments. One skilled in the art will recognize that the particular embodiments illustrated in the drawings and described herein are merely exemplary, and are not intended to limit scope.

DETAILED DESCRIPTION OF THE EMBODIMENTS

Figure 1:
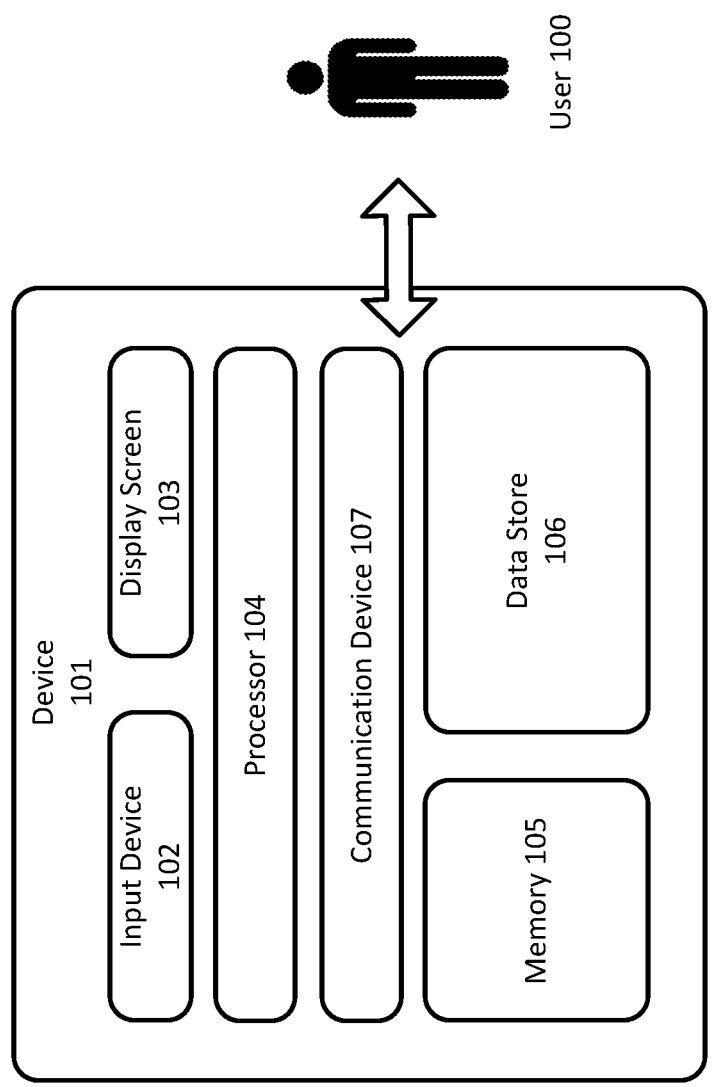
FIG. 1 is a block diagram depicting a hardware architecture for implementing the techniques described herein according to one embodiment.

In various embodiments, the techniques described herein can be applied in the context of compression and/or decompression techniques employed by an electronic device, network, or system; such compression and/or decompression can be performed by hardware, software, firmware, or any combination thereof, and can be applied to any type of data. Although the techniques are described herein in terms of data compression, one skilled in the art will recognize that such techniques can also be applied to other contexts.

One skilled in the art will further recognize that the techniques described herein can be implemented in a stand-alone device, client/server architecture, distributed network environment, and/or any other suitable architecture.

In some embodiments, one or more components, as shown and described below in connection with FIGS. 1 and 2, may be used to implement the system and method described herein. Such components may be implemented in a cloud computing-based client/server architecture, using, for example, Amazon Web Services, an on-demand cloud computing platform available from Amazon.com, Inc. of Seattle, Washington. For illustrative purposes, the system and method are described herein in the context of such an architecture. One skilled in the art will recognize, however, that the system and method can be implemented using other architectures, such as for example a stand-alone computing device rather than a client/server architecture.

Further, the functions and/or method steps set forth below may be carried out by software running on one or more of device 101, client device(s) 108, server 110, and/or other components. This software may optionally be multi-function software that is used to retrieve, store, manipulate, and/or otherwise use data stored in data storage devices such as data store 106, and/or to carry out one or more other functions.

For purposes of the description herein, a "user", such as user 100 referenced herein, is an individual, enterprise, or other group, which may optionally include one or more users. A "data store", such as data store 106 referenced herein, is any device capable of digital data storage, including any known hardware for nonvolatile and/or volatile data storage. A collection of data stores 106 may form a "data storage system" that can be accessed by multiple users. A "computing device", such as device 101 and/or client device(s) 108, is any device capable of digital data processing. A "server", such as server 110, is a computing device that provides data storage, either via a local data store, or via connection to a remote data store. A "client device", such as client device 108, is an electronic device that communicates with a server, provides output to user 100, and accepts input from user 100.

System Architecture

According to various embodiments, the system and method can be implemented on any electronic device or set of interconnected electronic devices, each equipped to receive, store, retrieve, and/or present information. Each electronic device may be, for example, a server, desktop computer, laptop computer, smartphone, tablet computer, and/or the like. As described herein, some devices used in connection with the system described herein are designated as client devices, which are generally operated by end users. Other devices are designated as servers, which generally conduct back-end operations and communicate with client devices (and/or with other servers) via a communications network such as the Internet. In at least one embodiment, the methods described herein can be implemented in a cloud computing environment using techniques that are known to those of skill in the art.

In addition, one skilled in the art will recognize that the techniques described herein can be implemented in other contexts, and indeed in any suitable device, set of devices, or system capable of interfacing with existing enterprise data storage systems. Accordingly, the following description is intended to illustrate various embodiments by way of example, rather than to limit scope.

Referring now to FIG. 1, there is shown a block diagram depicting a hardware architecture for practicing the described system, according to one embodiment. Such an architecture can be used, for example, for implementing the techniques of the system in a computer or other device 101. Device 101 may be any electronic device.

In at least one embodiment, device 101 includes a number of hardware components well-known to those skilled in the art. Input device 102 can be any element that receives input from user 100, including, for example, a keyboard, mouse, stylus, touch-sensitive screen (touchscreen), touchpad, trackball, accelerometer, microphone, or the like. Input can be provided via any suitable mode, including for example, one or more of: pointing, tapping, typing, dragging, and/or speech. In at least one embodiment, input device 102 can be omitted or functionally combined with one or more other components.

Data store 106 can be any magnetic, optical, or electronic storage device for data in digital form; examples include flash memory, magnetic hard drive, CD-ROM, DVD-ROM, or the like. In at least one embodiment, data store 106 stores information that can be utilized and/or displayed according to the techniques described below. Data store 106 may be implemented in a database or using any other suitable arrangement. In another embodiment, data store 106 can be stored elsewhere, and data from data store 106 can be retrieved by device 101 when needed for processing and/or presentation to user 100. Data store 106 may store one or more data sets, which may be used for a variety of purposes and may include a wide variety of files, metadata, and/or other data.

In at least one embodiment, data store 106 may store data depicting cost models for compression algorithms, and/or other information that may be used in performing the methods described herein. In at least one embodiment, such data can be stored at another location, remote from device 101, and device 101 can access such data over a network, via any suitable communications protocol.

In at least one embodiment, data store 106 may be organized in a file system, using well known storage architectures and data structures, such as relational databases. Examples include Oracle, MySQL, and PostgreSQL. Appropriate indexing can be provided to associate data elements in data store 106 with each other. In at least one embodiment, data store 106 may be implemented using cloud-based storage architectures such as NetApp (available from NetApp, Inc. of Sunnyvale, California), Amazon S3 (available from Amazon, Inc. of Seattle, Washington), and/or Google Drive (available from Google, Inc. of Mountain View, California).

Data store 106 can be local or remote with respect to the other components of device 101. In at least one embodiment, device 101 is configured to retrieve data from a remote data storage device when needed. Such communication between device 101 and other components can take place wirelessly, by Ethernet connection, via a computing network such as the Internet, via a cellular network, or by any other appropriate communication systems.

In at least one embodiment, data store 106 is detachable in the form of a CD-ROM, DVD, flash drive, USB hard drive, or the like. Information can be entered from a source outside of device 101 into a data store 106 that is detachable, and later displayed after the data store 106 is connected to device 101. In another embodiment, data store 106 is fixed within device 101.

In at least one embodiment, data store 106 may be organized into one or more well-ordered data sets, with one or more data entries in each set. Data store 106, however, can have any suitable structure. Accordingly, the particular organization of data store 106 need not resemble the form in which information from data store 106 is displayed to user 100. In at least one embodiment, an identifying label is also stored along with each data entry, to be displayed along with each data entry.

Display screen 103 can be any element that displays information such as text and/or graphical elements. In particular, display screen 103 may display a user interface for displaying selected compression algorithms and determined parameters, and/or for prompting user 100 to configure such algorithms. In at least one embodiment where only some of the desired output is presented at a time, a dynamic control, such as a scrolling mechanism, may be available via input device 102 to change which information is currently displayed, and/or to alter the manner in which the information is displayed.

Processor 104 can be a conventional microprocessor for performing operations on data under the direction of software, according to well-known techniques. Memory 105 can be random-access memory, having a structure and architecture as are known in the art, for use by processor 104 in the course of running software.

A communication device 107 may communicate with other computing devices through the use of any known wired and/or wireless protocol(s). For example, communication device 107 may be a network interface card ("NIC") capable of Ethernet communications and/or a wireless networking card capable of communicating wirelessly over any of the 802.11 standards. Communication device 107 may be capable of transmitting and/or receiving signals to transfer data and/or initiate various processes within and/or outside device 101.

Figure 2:
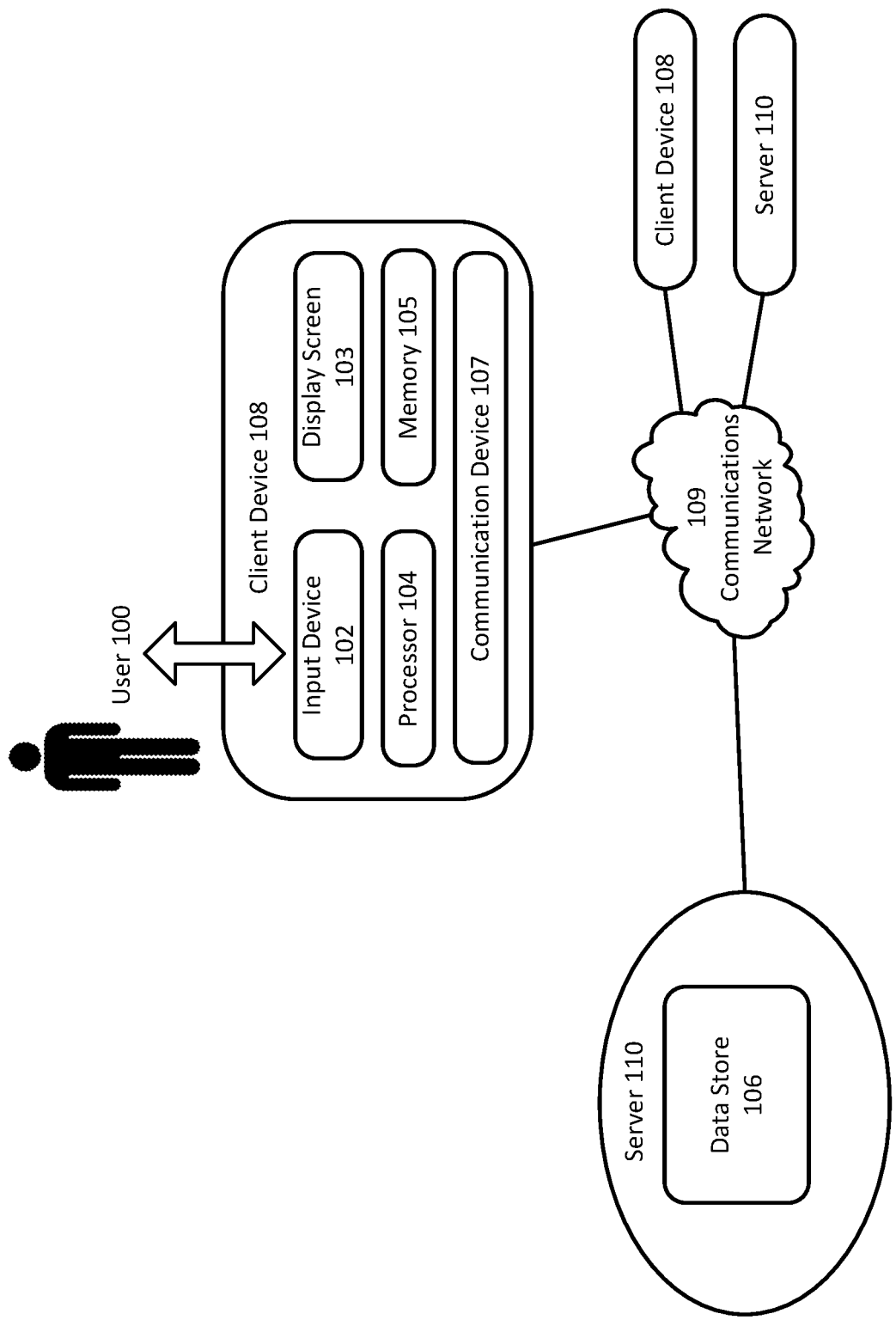
FIG. 2 is a block diagram depicting a hardware architecture for implementing the techniques described herein in a client/server environment, according to one embodiment.

Referring now to FIG. 2, there is shown a block diagram depicting a hardware architecture in a client/server environment, according to one embodiment. Such an implementation may use a "black box" approach, whereby data storage and processing are done completely independently from user in-put/output. An example of such a client/server environment is a web-based implementation, wherein client device 108 runs a browser that provides a user interface for interacting with web pages and/or other web-based resources from server 110. Items from data store 106 can be presented as part of such web pages and/or other web-based resources, using known protocols and languages such as Hypertext Markup Language (HTML), Java, JavaScript, and the like.

Client device 108 can be any electronic device incorporating input device 102 and/or display screen 103, such as a desktop computer, laptop computer, personal digital assistant (PDA), cellular telephone, smartphone, music player, handheld computer, tablet computer, kiosk, game system, wearable device, or the like. Any suitable type of communications network 109, such as the Internet, can be used as the mechanism for transmitting data between client device 108 and server 110, according to any suitable protocols and techniques. In addition to the Internet, other examples include cellular telephone networks, EDGE, 3G, 4G, 5G, long term evolution (LTE), Session Initiation Protocol (SIP), Short Message Peer-to-Peer protocol (SMPP), SS7, Wi-Fi, Bluetooth, ZigBee, Hypertext Transfer Protocol (HTTP), Secure Hypertext Transfer Protocol (SHTTP), Transmission Control Protocol/Internet Protocol (TCP/IP), and/or the like, and/or any combination thereof. In at least one embodiment, client device 108 transmits requests for data via communications network 109, and receives responses from server 110 containing the requested data. Such requests may be sent via HTTP as remote procedure calls or the like.

In one implementation, server 110 is responsible for data storage and processing, and incorporates data store 106. Server 110 may include additional components as needed for retrieving data from data store 106 in response to requests from client device 108.

As also set forth in FIG. 1, data store 106 may be organized into one or more well-ordered data sets, with one or more data entries in each set. Data store 106, however, can have any suitable structure, and may store data according to any organization system known in the information storage arts, such as databases and other suitable data storage structures. As in FIG. 1, data store 106 may store data depicting cost models for compression algorithms, and/or other information that may be used in performing the methods described herein; alternatively, such data can be stored elsewhere (such as at another server) and retrieved as needed.

In addition to or in the alternative to the foregoing, data may also be stored in a data store 106 present in client device 108. In some embodiments, such data may include elements distributed between server 110 and client device 108 and/or other computing devices in order to facilitate secure and/or effective communication between these computing devices.

As also set forth in FIG. 1, display screen 103 can be any element that displays information such as text and/or graphical elements. Various user interface elements, dynamic controls, and/or the like may be used in connection with display screen 103.

As also set forth in FIG. 1, processor 104 can be a conventional microprocessor for use in an electronic device to perform operations on data under the direction of software, according to well-known techniques. Memory 105 can be random-access memory, having a structure and architecture as are known in the art, for use by processor 104 in the course of running software. A communication device 107 may communicate with other computing devices through the use of any known wired and/or wireless protocol(s), as also set forth in the description of FIG. 1.

In one embodiment, some or all of the system can be implemented as software written in any suitable computer programming language, whether in a standalone or client/server architecture. Alternatively, it may be implemented and/or embedded in hardware.

Notably, multiple servers 110 and/or multiple client devices 108 may be networked together, and each may have a structure similar to those of client device 108 and server 110 that are illustrated in FIG. 2. The data structures and/or computing instructions used in the performance of methods described herein may be distributed among any number of client devices 108 and/or servers 110. As used herein, "system" may refer to any of the components, or any collection of components, from FIGS. 1 and/or 2, and may include additional components not specifically described in connection with FIGS. 1 and 2.

In some embodiments, data within data store 106 may be distributed among multiple physical servers. Thus, data store 106 may represent one or more physical storage locations, which may communicate with each other via the communications network and/or one or more other networks (not shown). In addition, server 110 as depicted in FIG. 2 may represent one or more physical servers, which may communicate with each other via communications network 109 and/or one or more other networks (not shown).

In one embodiment, some or all components of the system can be implemented in software written in any suitable computer programming language, whether in a standalone or client/server architecture. Alternatively, some or all components may be implemented and/or embedded in hardware.

Method

Figure 3:
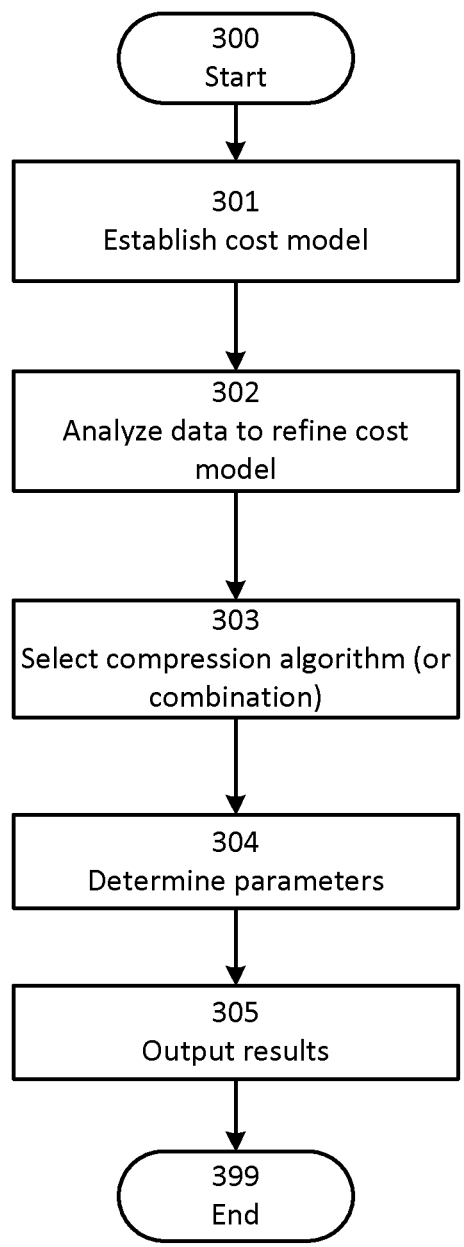
FIG. 3 is flow diagram depicting an overall method for selecting data compression parameters using a cost model, according to one embodiment.

Referring now to FIG. 3, there is shown a flow diagram depicting an overall method for selecting data compression parameters using a cost model, according to one embodiment. One skilled in the art will recognize that the particular steps depicted in FIG. 3 are merely exemplary, and that the techniques described herein can be performed using other method steps and/or using steps in a different order.

The depicted method can be implemented on any suitable hardware device or combination of devices, such as on a stand-alone device, client/server architecture, distributed network environment, and/or any other suitable architecture. In some embodiments, the depicted method can be performed using architectures such as those shown in FIGS. 1 and 2; however, one skilled in the art will recognize that other suitable hardware architectures may be used.

The method begins 300. As a first step, a cost model is established 301. In at least one embodiment, the cost model may include estimates of financial costs of computation for compression and/or decompression, estimates about lifetime and usage of the data (including latency requirements), and/or a sample of the data. Next, the data in question is analyzed 302 to refine the cost model. Based on the analysis, a particular compression algorithm (or combination thereof) is selected 303, and best parameters for the selected algorithm (or combination) are determined 304 so as to optimize financial savings. The results are output 305, and the method then ends 399.

In at least one embodiment, step 301 includes receiving pricing data for various CPU costs (including current costs that a particular cloud provider is charging, and possibly spare CPU capacity on existing machines that may have a cost of zero), as well as data about the expected lifetime and usage of the data in question. In various embodiments, such data may be derived from the type of the data, and/or may be determined by a machine-learning classifier.

In at least one embodiment, step 301 further includes estimating the computational cost of compressing and/or decompressing the data, and the expected savings over the lifetime of the data that accrues from compression/decompression. In order to perform this estimation, in at least one embodiment test compression (and/or decompression) can be performed on a sample of the data under various compression/decompression settings and parameters. In addition or instead of such an approach, statistical/machine-learning estimation can be performed. Then as described above, the data in question is analyzed 302 to refine the cost model, a particular compression algorithm (or combination thereof) is selected 303, and best parameters for the selected algorithm (or combination) are determined 304. In at least one embodiment, steps 303 and 304 include choosing the most cost-advantageous compression method, settings, and parameters. In at least one embodiment, the system can also take into account additional constraints such as latency requirements, maximum CPU usage for compression, maximum RAM usage for compression, and/or the like.

In at least one embodiment, step 305 includes displaying output for user 100, for example via display screen 103 or another output device. In other embodiments, step 305 can include automatically applying the selected compression algorithm (with determined parameters) to data.

In this manner, the described method takes into account the computational cost of compressing and/or decompressing the data, as well as a cost model for the data's lifetime. The method is then able to select an appropriate compression/decompression algorithm, and its parameters/configuration, based on:

An estimate of the total lifetime cost of the compressed data (by volume); and/or An estimate of the computational cost of compressing and/or decompressing the data (based, for example, on one or more samples of the data).

Figure 4:
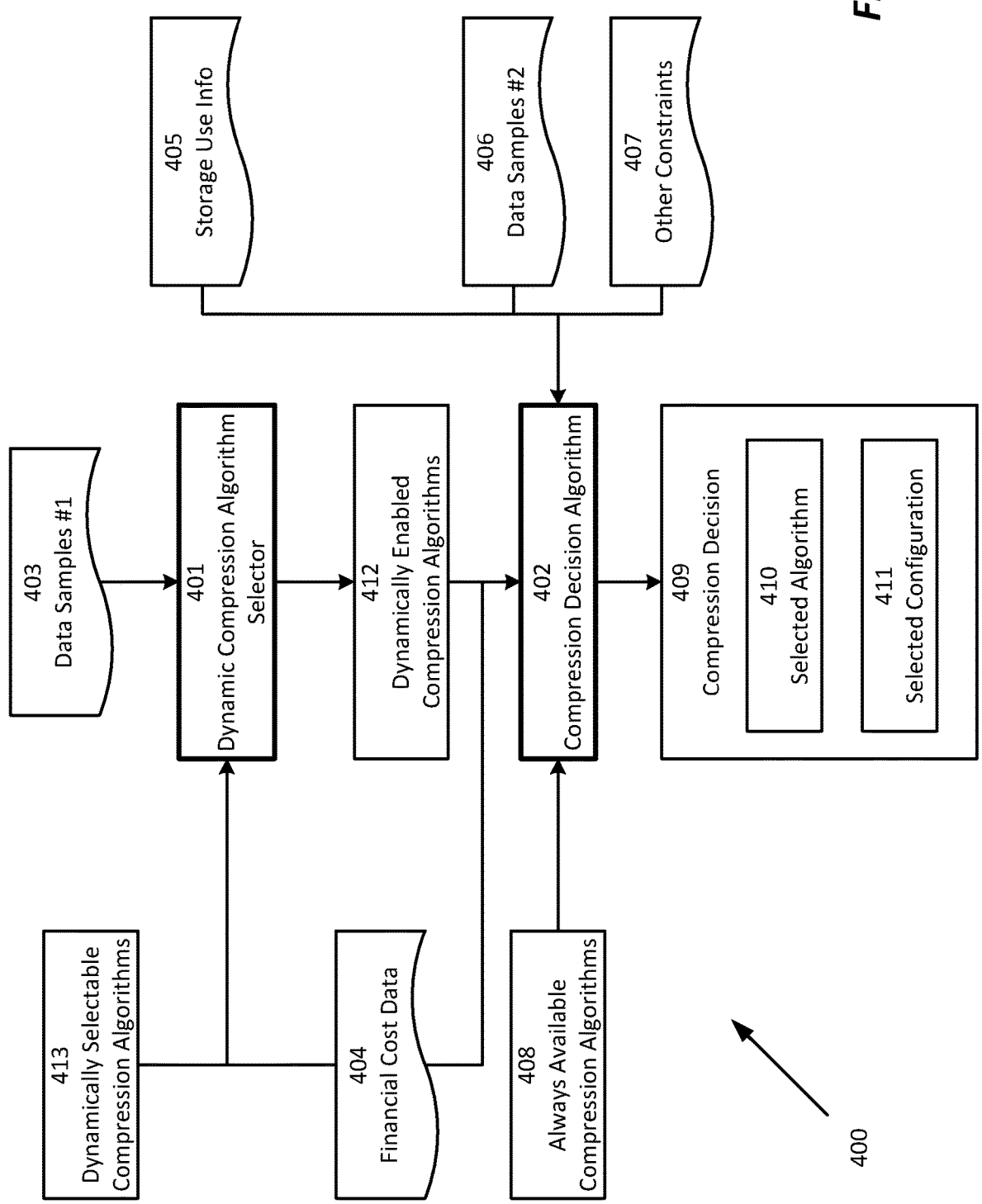
FIG. 4 is block diagram depicting a software architecture for selecting data compression parameters using a cost model, according to one embodiment.

Referring now to FIG. 4, there is shown a flow diagram depicting a software architecture 400 for selecting data compression parameters using a cost model, according to one embodiment. In particular, FIG. 4 depicts additional details regarding the relationship between inputs and outputs, and the algorithm for making compression decisions, so as to select the best compression algorithm and configuration for particular data, based on various factors including a cost model.

Software architecture 400 can be implemented on any suitable hardware device or combination of devices, such as on a stand-alone device, client/server architecture, distributed network environment, and/or any other suitable architecture. In some embodiments, software architecture 400 can be performed using architectures such as those shown in FIGS. 1 and 2; however, one skilled in the art will recognize that other suitable hardware architectures may be used.

In FIG. 4, elements 401 and 402 represent functional modules that are used in making compression decisions, elements 403 through 407 represent data used in such decisions, element 408 represents always available compression algorithms, element 412 represents dynamically available compression algorithms, and element 409 represents a compression decision, including a selected algorithm 410 and a selected configuration 411. Arrows represent data flow. In at least one embodiment, compression decision 409 is based on the various inputs provided to algorithm 402, including financial cost data 404, storage use information 405, and/or other available constraints and factors 407. As mentioned above, in at least one embodiment, compression decision 409 can be output for viewing by user 100 on display screen 103 or another output device, or can be used to automatically select a compression method without requiring user involvement.

In at least one embodiment, establishment of the cost model in step 301 of FIG. 3 includes a two-stage instantiation: in the first stage, performed by dynamic compression algorithm selector 401, processing is performed for estimating savings that might be realized by computing new compression dictionaries for those compressors that are capable of using such dictionaries. Processing is then performed for estimating the cost (in terms of CPU cycles, network bandwidth, storage requirements, and/or the like) that might result from computing and using such dictionaries. The results of this analysis are then made available to the second stage.

In the second stage, performed by compression decision algorithm 402, available compression algorithms 408, 412 and configurations are compared against each other to select the optimal algorithm and configuration to use for the task at hand. In at least one embodiment, this is performed by evaluating a set of test data and generating estimates of true compression ratios. Compression decision algorithm 402 combines these estimates with storage use information and other constraints to make a compression decision.

In at least one embodiment, both the first and second stages use provided financial cost data 404 as a component of their actions and decisions. In an alternative embodiment, financial cost data 404 is only used in the second stage.

In at least one embodiment, after a compression decision has been made, actual real-world data is gathered and fed back into the system to refine the decision and improve future decisions.

In at least one embodiment, software architecture 400 includes several data items and functional components. Each will be described in turn.

Data samples #1 403: A set of representative samples of the data to be compressed by the selected compression algorithm. These are used by dynamic compression algorithm selector 401 to specialize various compression algorithms based on the particular characteristics of the data being compressed. In at least one embodiment, data samples #1 403 may be based on a representative sample of real data to be compressed. Thus, data samples #1 403 may constitute a training set. In at least one embodiment, the contents of data samples #1 403 may be determined by the needs of dynamic compression algorithm selector 401. For example, if dynamic compression algorithm selector 401 may compute new compression dictionaries, then the system ensures that data samples #1 403 are sufficiently large for that task.

Dynamically selectable compression algorithms 413: A set of compression algorithms [A1, A2, . . . , An] from which dynamic compression algorithm selector 401 can make selections using the techniques described herein.

Dynamic compression algorithm selector 401: A software component that decides which algorithms from dynamically selectable compression algorithms 413 to include in dynamically enabled compression algorithms 412. This decision can be based, for example, on data samples #1 403 (and optionally on financial cost data 404). As discussed above, dynamic compression algorithm selector 401 receives data samples #1 403, which may be a training set extracted from available data, as well as a set of dynamically selectable compression algorithms 413 [A1, A2, . . . , An]. Dynamic compression algorithm selector 401 may use the retrieved information to provide one or more custom compression dictionaries for use during compression.

Different algorithms may require different compression dictionary formats and other parameters; for example, some algorithms may pay a higher penalty for larger compression dictionaries than others. Therefore, in at least one embodiment, dynamic compression algorithm selector 401 takes into account such requirements when generating one or more compression dictionaries for use with a particular compression algorithm.

In at least one embodiment, the output of dynamic compression algorithm selector 401 a set of dynamically enabled compression algorithms 412. These may be expressed as a number of pairs of the form [(A1, C1), (A1, C2), (A2, C3), . . . (An, Cm)] specifying combinations of compression algorithms A (selected from dynamically selectable compression algorithms 413) with different configurations C. Such configurations may specify particular custom dictionaries D for each algorithm A, and/or they may specify other parameters.

Dynamically enabled compression algorithms 412: A list of (compressor, configuration) pairs specifying compression algorithms and configurations of those algorithms that dynamic compression algorithm selector 401 has decided should be considered, alongside always available compression algorithms 408. In at least one embodiment, dynamically enabled compression algorithms 412 includes algorithms that have some cost associated with considering them. For example, it may have been necessary to compute a new compression dictionary in order to consider the algorithm. In at least one embodiment, dynamically enabled compression algorithms 412 are used by compression decision algorithm 402.

Financial cost data 404: An indication of the financial cost of each computation, data transfer, storage, and/or any other action for which the cloud provider charges. In various embodiments, financial cost data 404 may be used by dynamic compression algorithm selector 401, compression decision algorithm 402, or both. Financial cost data 404 may include a cost model.

Always available compression algorithms 408: A list of (compressor, configuration) pairs, specifying compression algorithms and configurations of those algorithms that should always be considered when deciding which to recommend (in addition to dynamically enabled compression algorithms 412 determined by dynamic compression algorithm selector 401). In at least one embodiment, this list includes those algorithms that have no cost associated with considering them. In at least one embodiment, the list of always available compression algorithms 408 is used by compression decision algorithm 402.

Storage use info 405: Data on the expected storage lifetime of the data to be compressed, as well as the expected number of times it will be read. In at least one embodiment, storage use info 405 is used by compression decision algorithm 402.

Data samples #2 406: A set of representative samples of the data to be compressed by the selected algorithm. This list may or may not be the same as data samples #1 403. In at least one embodiment, the contents of data samples #2 406 are determined by the needs of compression decision algorithm 402, and are used by algorithm 402. In at least one embodiment, data samples #1 403 are used to train algorithms, and data samples #2 406 are used to evaluate the algorithms.

Other constraints 407: Non-financial constraints that compression decision algorithm 402 may want to consider when selecting the best algorithm to use. For example, there may be latency considerations to be considered. In at least one embodiment, other constraints 407 are used by compression decision algorithm 402.

In at least one embodiment, compression decision algorithm 402 takes input from components 404, 405, 406, and 407, and uses such data to select an algorithm from the compression algorithms listed in components 408 and 412. Compression decision algorithm 402 also selects a configuration for the selected compression algorithm. Compression decision algorithm 402 generates, as output, compression decision 409.

Compression decision 409: The output of compression decision algorithm 402. In at least one embodiment, compression decision 409 is a pair (compressor, configuration)

specifying a selected algorithm 401 and a selected configuration 411, taking into account the provided financial costs and other constraints and factors.

Example Pseudo-Code

The following pseudo-code describes examples of implementations and embodiments for various components in FIG. 4.

In at least one embodiment, dynamic compression algorithm 401 may use logic such as that described by the following pseudo-code:

```
func DynamicallySelectAlgorithms(samples) {
    trainingData, testData=splitSamples(samples)
    for compressor, config in candidateCompressors {
        //Compute a dictionary from a smaller subset of the
            available sample
        //data. This is done because to create a dictionary
            from the entire
        //data set is likely expensive, and must be weighed
            into the selection
        //decision in 'GetBestCompression'. We could also
            possible avoid
        //computing any dictionary here and instead have
            some interval of
        //expected savings from new dictionaries on a per-
            compressor basis.
        newDict=computeDictionary(trainingData)
        newConfig=cloneConfig(config)
        newConfig.dict=newDict
        //Run the compressor on the test data to determine
            the
        //expected compression ratio with the new diction-
            ary. This also
        //stores an 'extraCPU' field in the compressResult
            indicating
        //the expected number of CPU seconds required to
            compute a
        //full dictionary, as well as 'extraStorage' and
            'extraNetwork'
        //fields, indicating the expected cost of storing and
            transferring
        //that dictionary, as required.
        compressResult=runCompressor(compressor,
            newConfig, testData)
        addAvailableCompressor(
            compressor, config, getDefaultCompressResult
                (compressor, config))
        addAvailableCompressor(compressor, newConfig,
            compress Result)
    }
}
```

In at least one embodiment, compression decision algorithm 402 may use logic such as that described by the following pseudo-code:

```
func GetBestCompression(availableCompressors, laten-
    cyRequirement,
    samples, financialCosts, expectedNumReads, storage-
        Duration,
    includeNetworkCost, includeStorageCost, includeC-
        PUCost)
{
    selected=None
    //Iterate over all available compressor and config pairs
        to find the best
    for compressor, config in availableCompressors {
        //Run the compressor on the sample data
        compressResult=runCompressor(compressor, con-
            fig, samples)
        //Check if any of the hard constraints are violated.
            In this case
        //we only have a hard constraint on latency
        if compressResult.avgLatency>latencyRequirement
            {continue
        }
        cpuCost=storageCost=networkCost=0
        if includeCPUCost {
            //Calculate the expected cost of the computation
                time required to
            //compress and decompress the data
            cpuCost=getCPUCost(
                compressResult.avgCompressTime, com-
                    pressRe-sult. avgDecompressTime,
                expectedNumReads,   getCostPerCPUSecond
                    (financialCosts))
        }
        if includeStorageCost {
            //Calculate the expected cost of storing the data,
                including any
            //extra data that might be needed by this compres-
                sion method (e.g.
            //a shared dictionary)
            storageCost=getStorageCost(
                samples,   storageDuration,   compressResult.
                    avgRatio,
                compressResult.extraStorage,
                getCostPerGBPerMonth(financialCosts))
        }
        if includeNetworkCost {
            //Calculate the expected cost of sending this
                data over the
            //network, including an extra data that might be
                needed by this
            //compression method (e.g. a shared dictionary)
            networkCost =getNetworkCost(
                samples, compressResult.avgRatio,
                compressResult.extraNetwork,
                getCostPerGBXFer(financialCosts))
        }
        totalCost=cpuCost+storageCost+networkCost
        //Check if the overall cost of this compression
            method is lower than
        //the best we have found so far
        if selected is None or totalCost <selectedCost {
            selected =(compressor, config)
        }
    }
    return selected
}
```

Sample Applications

One skilled in the art will recognize that the system and method described herein can be used in many different applications. The following examples are provided for illustrative purposes only.

Cost-model Aware Cloud Storage Compression Proxy

Figure 5:
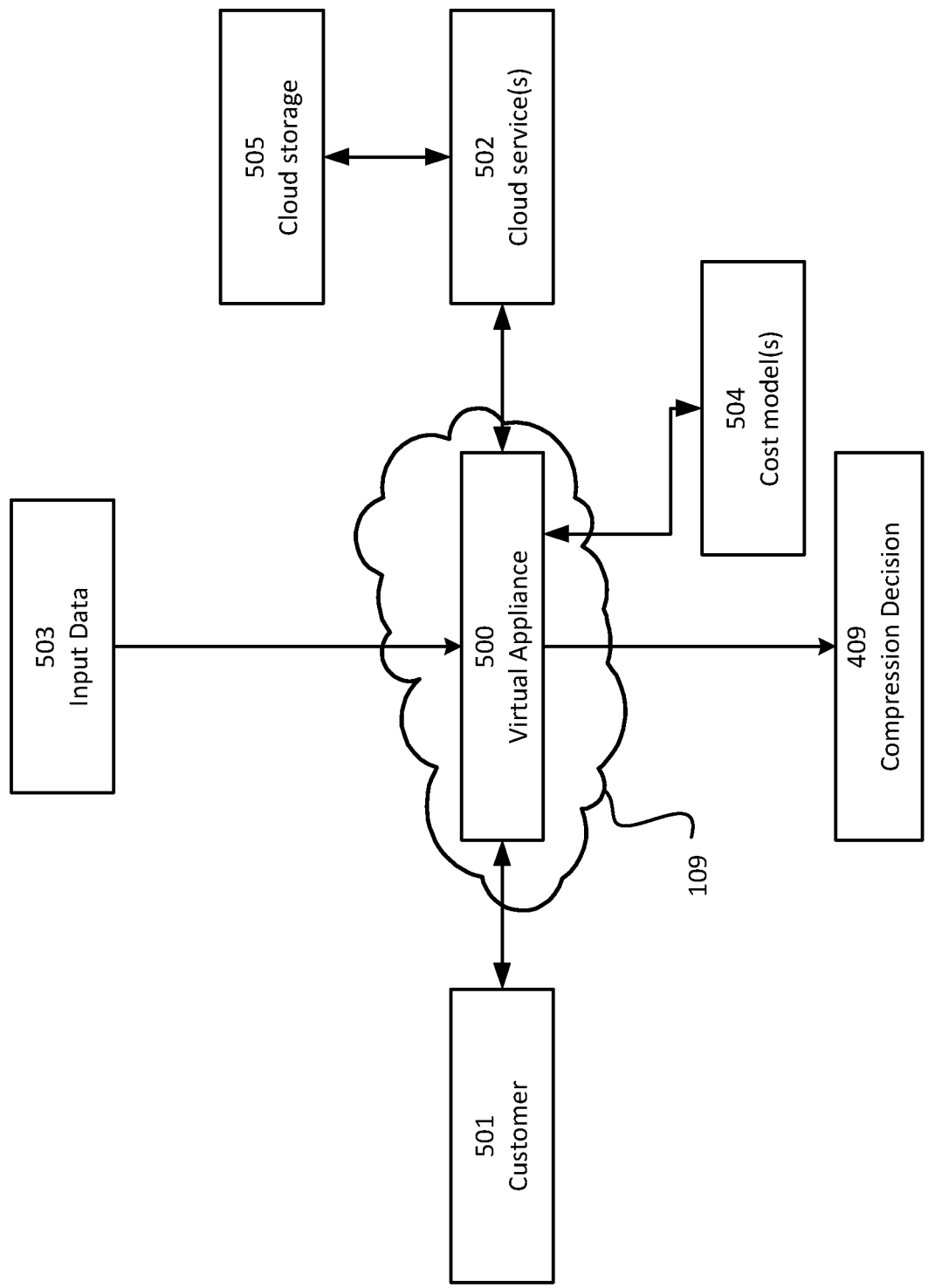
FIG. 5 is block diagram depicting an example of an architecture for an application wherein the system is implemented in a virtual appliance running on a network, according to one embodiment.

Referring now to FIG. 5, there is shown an example of an architecture for an application wherein the system is implemented in a virtual appliance 500 running on communications network 109, according to one embodiment. In this application, virtual appliance 500 includes various functional components for performing the methods described herein, including for example, dynamic compression algorithm selector 401 and compression decision algorithm 402. Virtual appliance 500 resides between customer 501 and any number of cloud services(s) 502 running cloud storage 505 operated by S3, GCS, and/or the like.

In at least one embodiment, virtual appliance 500 performs the steps described above in connection with FIG. 3. Input data 503 for virtual appliance 500 (which may include data 403, 404, 405, 406, 407, and/or any other suitable input data) can be provided by customer 501, or it can be learned by virtual appliance 500 from observing actual usage over time. Examples of input data 503 that can be used in establishing 301 the cost model and/or determining 304 parameters may include, but are not limited to:

Expected lifetime of the data;
Number of times the data is expected to be compressed/decompressed over its lifetime;
Number of times the data is transferred over network links during its lifetime, and per-volume cost of these transfers;
Cost of CPU-seconds for various CPUs; and
A sample of the data.

In at least one embodiment, virtual appliance 500 can store multiple cost models 301 for different storage patterns; these can be identified, for example, by naming convention, metadata, and/or the like, and can be retrieved as needed by virtual appliance 500.

In at least one embodiment, customer 501 sends and receives uncompressed data to virtual appliance 500. Using the techniques described herein, virtual appliance 500 uses compression decision algorithm 402 to select a compression algorithm 410 and configuration 411, using financial cost data 404 including a cost model. Then, in at least one embodiment, transparently for customer 501, virtual appliance 500 compresses data flowing between cloud service(s) 502 and customer 501 using the selected algorithm 410 and configuration 411. The compressed data may be stored in cloud storage architecture 505, such as S3, GCS, and/or the like, associated with cloud service(s) 502. Such cloud storage 505 is often paid for on a by-volume basis.

In at least one embodiment, the functionality described above for virtual appliance 500 can be implemented in proxy software running on an existing component such as a client or server, without the need for a separate hardware component. For example, such software can run on the same machine that accesses cloud storage.

Cost-Model Aware Cloud Network Virtual Network Interface

Figure 6A:
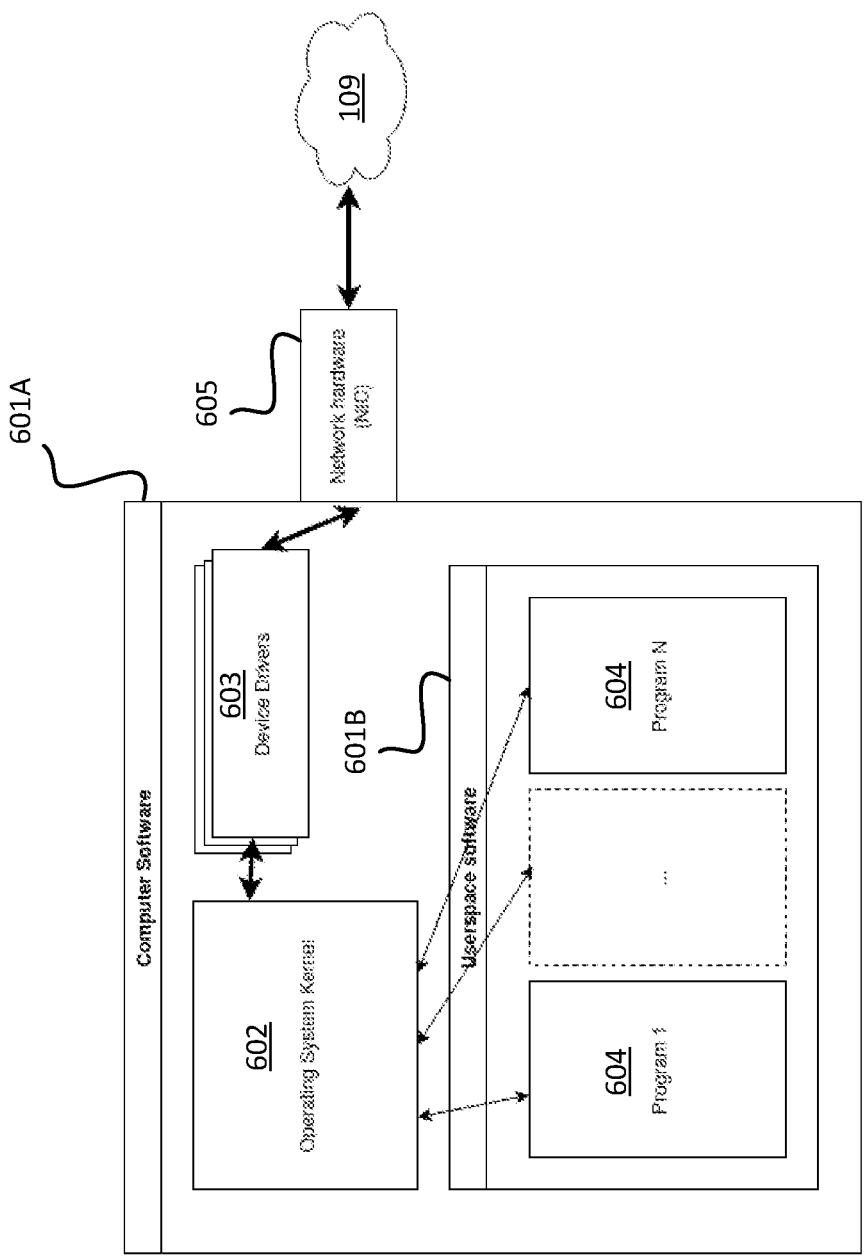
FIG. 6A is a block diagram depicting an example of an architecture for an application wherein the system is implemented using one or more device drivers, according to one embodiment.

Referring now to FIG. 6A, there is shown an example of an architecture wherein the system is implemented using one or more device drivers 603, according to one embodiment. Computer software 601A and user space software 601B may run software implementing the functionality described herein on any suitable electronic device. In at least one embodiment, an operating system kernel 602 interacts with any number of programs 604 running within user space 601B. Device driver(s) 603 communicate with network hardware 605 such as a network interface card (NIC) that enables communication with other electronic components via network 109.

Figure 6B:
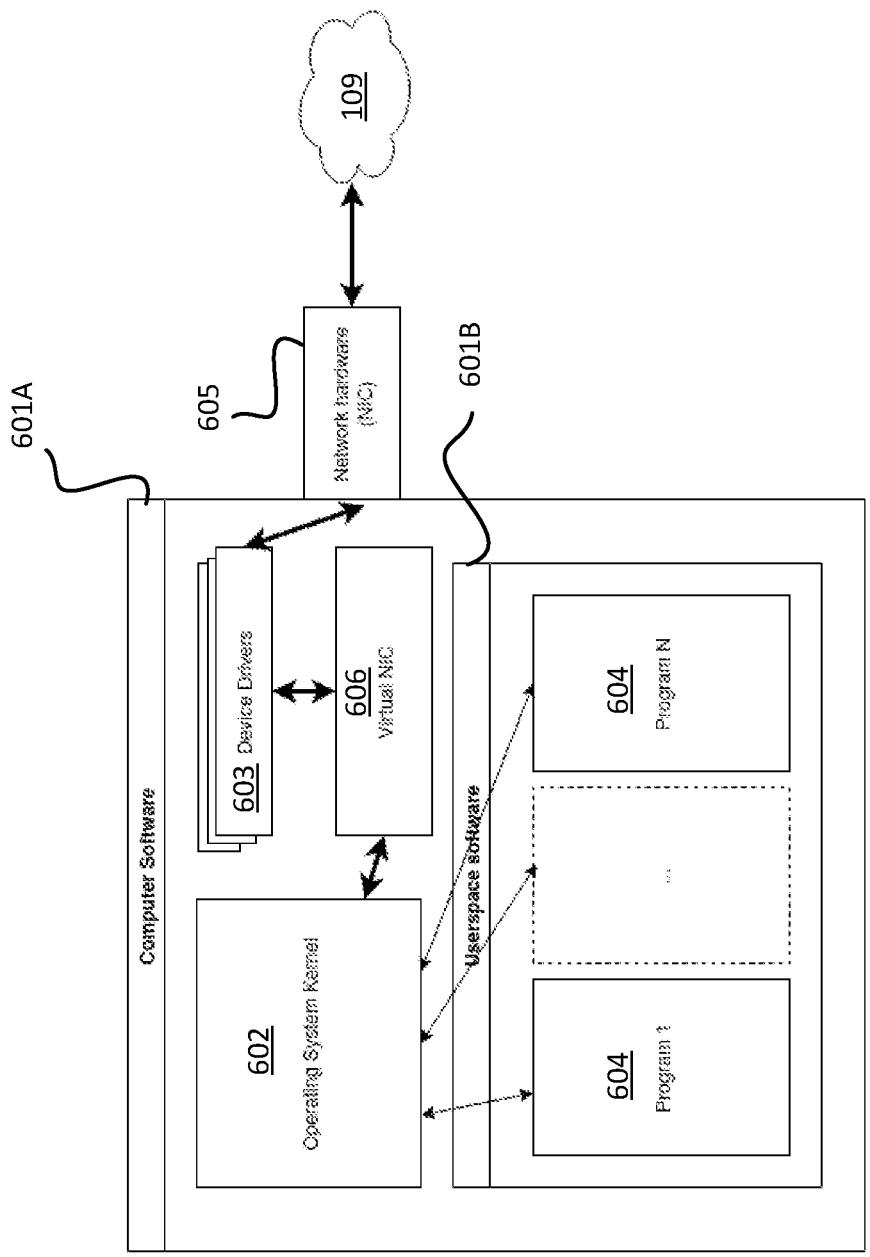
FIG. 6B is a block diagram depicting an example of an architecture for an application wherein the system is implemented using one or more device drivers in connection with a virtual network interface card (NIC), according to one embodiment.

Referring now to FIG. 6B, there is shown an example of an architecture similar to that of FIG. 6A, but including a virtual NIC 606 that can be implemented in software. In at least one embodiment, virtual NIC 606 acts as an intermediary between operating system kernel 602 and device drivers 603.

In either of the architectures shown in FIGS. 6A and 6B, device driver(s) 603 may optionally be installed in a distributed fashion on a large network of machines. Device driver(s) 603 use NIC 605 and/or virtual NIC 606 to communicate with other machines to monitor available CPU capacity on network peers. Device driver(s) 603 can then use the techniques described herein to automatically adjust compression parameters for network traffic to optimize costs while keeping latency and CPU headroom requirements intact. In at least one embodiment, this process is entirely transparent to the local software.

Cost-Model Aware Cloud Network Virtual Network Interface

Figure 6C:
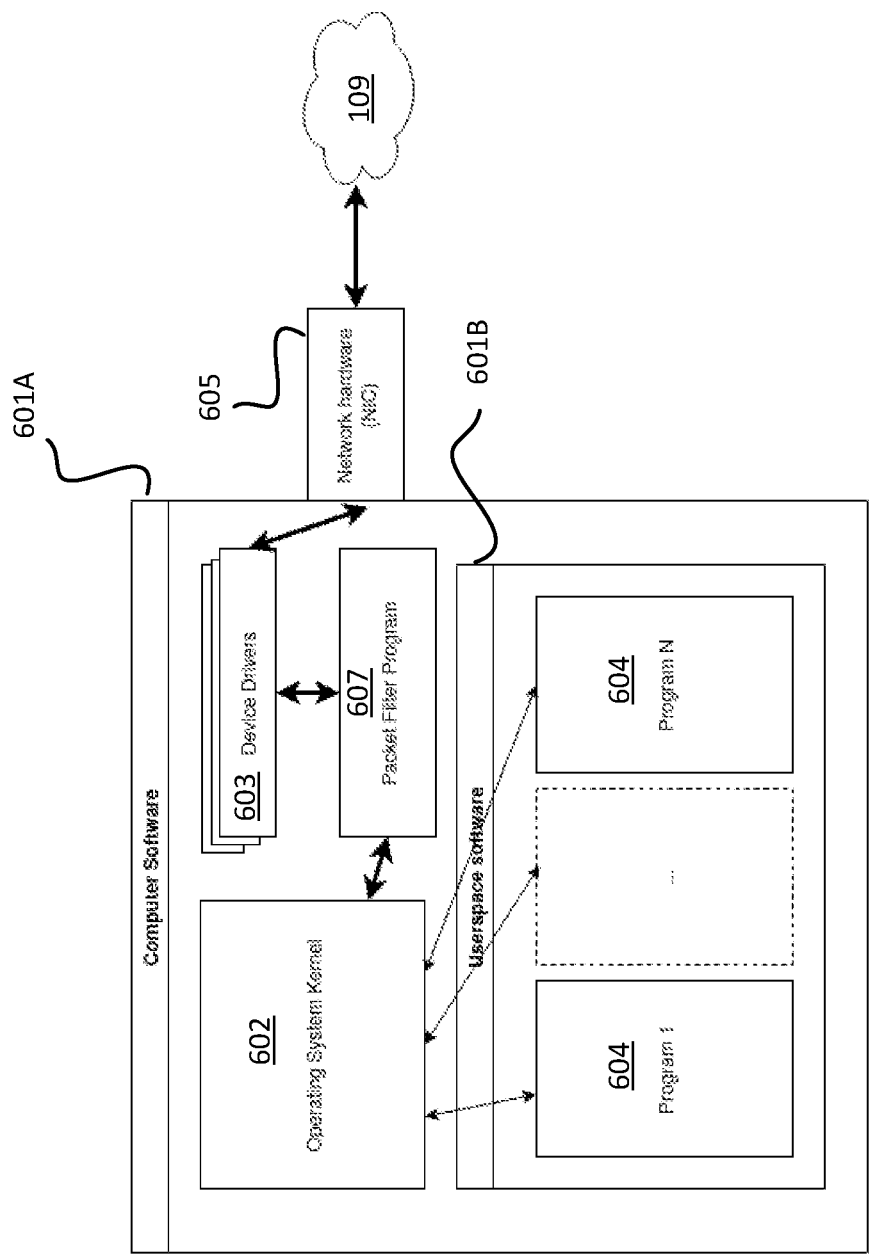
FIG. 6C is a block diagram depicting an example of an architecture for an application wherein the system is implemented using one or more device drivers in connection with a packet filter program, according to one embodiment.

Referring now to FIG. 6C, there is shown an example of an architecture similar to that of FIG. 6A, but including a packet filter program 607 that can be implemented in software. Modern operating systems provide sophisticated firewalling mechanisms and programming languages, implemented as packet filter programs 607, to make firewalling and packet routing decisions. In many cases, such components are sufficiently powerful to implement the data compression and decision-making methodologies described herein. One advantage of implementing the functionality described herein using packet filter program 607 is that packet filter programs 607 cannot generally crash the system. Furthermore, packet filter programs 607 can be installed in environments where a custom device driver may be undesirable for security or reliability reasons.

In at least one embodiment, packet filter program 607 may optionally be installed in a distributed fashion on a large network of machines. Packet filter program 607 communicates with other machines to monitor available CPU capacity on network peers and to automatically adjust compression parameters for network traffic to optimize costs while keeping latency and CPU headroom requirements intact. In at least one embodiment, this process is entirely transparent to the local software.

In at least one embodiment using an architecture similar to that depicted in FIGS. 6A, 6B, and/or 6C, the system can monitor CPU usage (and/or other system resource usage) and can automatically disable compression if CPU usage (and/or other system resource usage) exceeds a predefined amount, or if the system determines that CPU is under pressure or that its performance is compromised. The system can also automatically resume compression upon determining that CPU usage (and/or other system resource usage) has fallen to a sufficiently low level to allow compression to resume without compromising performance. In this manner, the described system is able to avoid pushing the CPU over its limit and degrading performance.

Cost-Model Aware Cloud Network Transfer Compression Proxy

Cloud providers charge per volume of traffic between datacenters, availability zones, and even within a datacenter for traffic between virtual private networks/circuits (VPCs). In at least one embodiment, the system can be implemented using a pair of virtual appliances configured to run on either end of a network connection that is metered by volume. All network traffic is routed through these appliances, and the appliances use a cost model (as described above) that incorporates a per-CPU-second cost of the cloud provider, latency requirements (possibly specified per network protocol or inferred from the network protocol), and/or the like, to decide on the optimal compression algorithm to use.

Figure 7A:
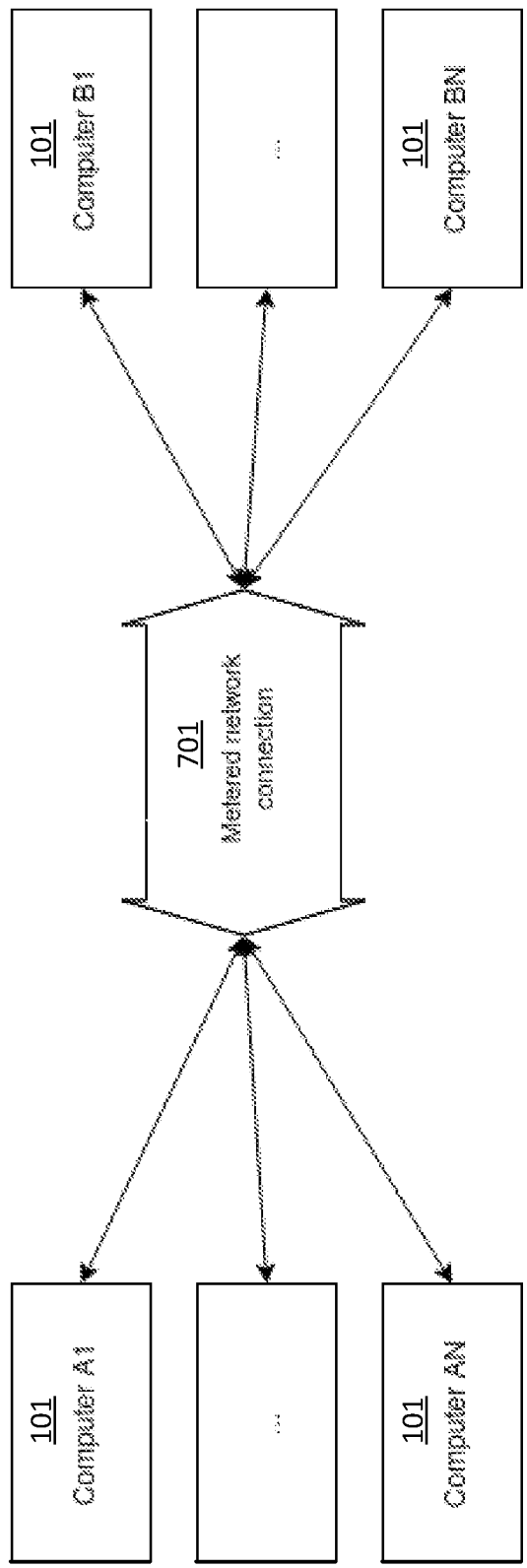
FIG. 7A is a block diagram depicting an example of an architecture for an application wherein the system is implemented in a metered network connection between two sets of computers, according to one embodiment.
Figure 7B:
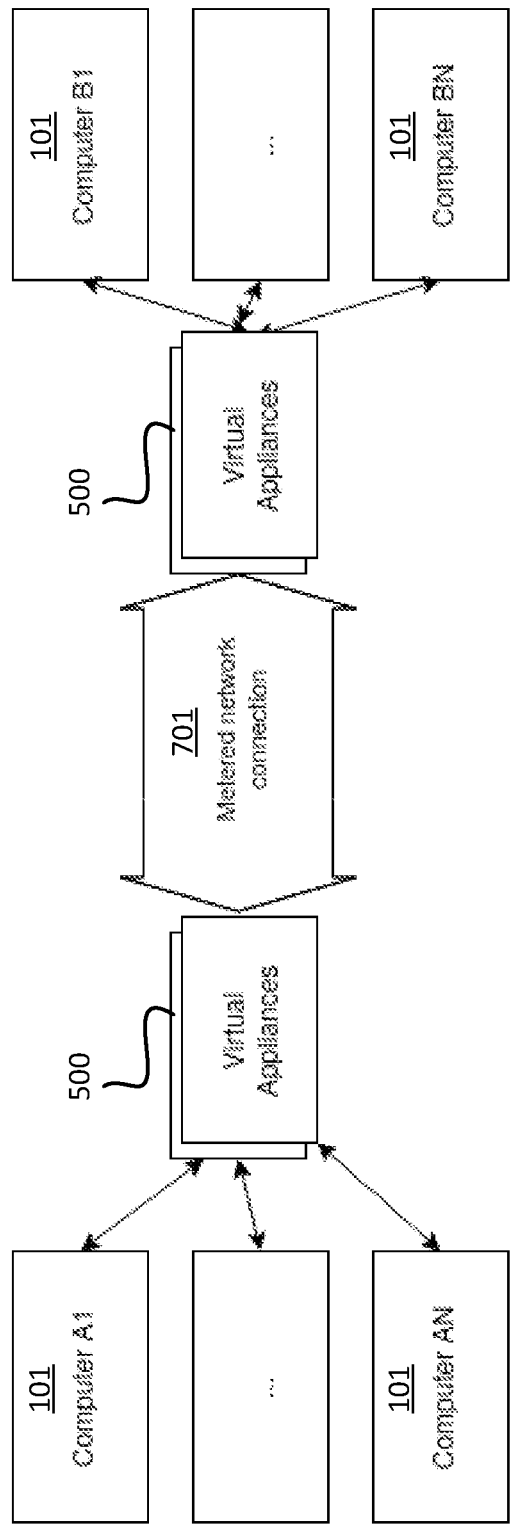
FIG. 7B is a block diagram depicting an example of an architecture for an application wherein the system is implemented in a metered network connection between two sets of virtual appliances and two sets of computers, according to one embodiment.

Referring now to FIG. 7A, there is shown a block diagram depicting an example of an architecture for an application wherein the system is implemented in a metered network connection 701 between two sets of computers 101, according to one embodiment. Referring now to FIG. 7B, there is shown a block diagram depicting an example of a similar architecture, but with virtual appliances 500 installed between metered network connection 701 and each set of computers 101, according to one embodiment.

In at least one embodiment, when CPU-time spot prices fall, the system can automatically activate more CPUs and/or appliances, and/or can switch to a more computationally expensive compression algorithm.

Cost-Model Aware Proxy to Provide Cheaper Internet Access to Roaming Mobile Devices In at least one embodiment, the system is implemented as software running on a mobile device such as a smartphone, running in conjunction with software running on a virtual appliance. The two software components communicate with one another; specifically, the mobile device transmits information about the per-GB cost of data to the virtual appliance, and the virtual appliance runs the optimization algorithm to decide on the best compression algorithm to use. The virtual appliance then communicates this choice to the mobile device; subsequent traffic to and from the mobile device is routed via the virtual appliance and compressed accordingly. This arrangement allows a mobile device that uses a metered-by-volume data connection to benefit from the techniques described herein.

Cost-Model Aware Compression-Dictionary Management

In compression systems that make use of configurable and/or replaceable compression dictionaries, a decision on whether it is sensible to create a new compression dictionary traditionally involves determining whether the space savings that would result from a new dictionary outweighs the cost of generating or switching to the new dictionary. In at least one embodiment, the system described herein can be used to inform such a decision, by taking into account the cost of the computation required to generate the new dictionary. In a shared-dictionary system whereby the compression dictionary must be conveyed to each device that is performing compression and decompression, at least one embodiment of the described system can also take into account the cost of the transfer and storage of the compression dictionaries.

Applicability to Lossy Compression

The above examples are set forth in terms of lossless compression. However, the techniques described herein can also be applied to other compression techniques, including lossy compression. In lossy compression, it is often possible to achieve a higher degree of compression at the same quality if one is willing to spend more computational power on it; accordingly, similar trade-offs to those discussed above may apply.

The present system and method have been described in particular detail with respect to possible embodiments. Those of skill in the art will appreciate that the system and method may be practiced in other embodiments. First, the particular naming of the components, capitalization of terms, the attributes, data structures, or any other programming or structural aspect is not mandatory or significant, and the mechanisms and/or features may have different names, formats, or protocols. Further, the system may be implemented via a combination of hardware and software, or entirely in hardware elements, or entirely in software elements. Also, the particular division of functionality between the various system components described herein is merely exemplary, and not mandatory; functions performed by a single system component may instead be performed by multiple components, and functions performed by multiple components may instead be performed by a single component.

Reference in the specification to "one embodiment" or to "an embodiment" means that a particular feature, structure, or characteristic described in connection with the embodiments is included in at least one embodiment. The appearances of the phrases "in one embodiment" or "in at least one embodiment" in various places in the specification are not necessarily all referring to the same embodiment.

Various embodiments may include any number of systems and/or methods for performing the above-described techniques, either singly or in any combination. Another embodiment includes a computer program product comprising a non-transitory computer-readable storage medium and computer program code, encoded on the medium, for causing a processor in a computing device or other electronic device to perform the above-described techniques.

Some portions of the above are presented in terms of algorithms and symbolic representations of operations on data bits within a memory of a computing device. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "displaying" or "determining" or the like, refer to the action and processes of a computer system, or similar electronic computing module and/or device, that manipulates and transforms data represented as physical (electronic) quantities within the computer system memories or registers or other such information storage, transmission or display devices.

Certain aspects include process steps and instructions described herein in the form of an algorithm. It should be noted that the process steps and instructions can be embodied in software, firmware and/or hardware, and when embodied in software, can be downloaded to reside on and be operated from different platforms used by a variety of operating systems.

The present document also relates to an apparatus for performing the operations herein. This apparatus may be specially constructed for the required purposes, or it may comprise a general-purpose computing device selectively activated or reconfigured by a computer program stored in the computing device. Such a computer program may be stored in a computer readable storage medium, such as, but is not limited to, any type of disk including floppy disks, optical disks, CD-ROMs, DVD-ROMs, magnetic-optical disks, read-only memories (ROMs), random access memories (RAMs), EPROMs, EEPROMs, flash memory, solid state drives, magnetic or optical cards, application specific integrated circuits (ASICs), or any type of media suitable for storing electronic instructions, and each coupled to a computer system bus. Further, the computing devices referred to herein may include a single processor or may be architectures employing multiple processor designs for increased computing capability.

The algorithms and displays presented herein are not inherently related to any particular computing device, virtualized system, or other apparatus. Various general-purpose systems may also be used with programs in accordance with the teachings herein, or it may prove convenient to construct more specialized apparatus to perform the required method steps. The required structure for a variety of these systems will be apparent from the description provided herein. In addition, the system and method are not described with reference to any particular programming language. It will be appreciated that a variety of programming languages may be used to implement the teachings described herein, and any references above to specific languages are provided for disclosure of enablement and best mode.

Accordingly, various embodiments include software, hardware, and/or other elements for controlling a computer system, computing device, or other electronic device, or any combination or plurality thereof. Such an electronic device can include, for example, a processor, an input device (such as a keyboard, mouse, touchpad, track pad, joystick, trackball, microphone, and/or any combination thereof), an output device (such as a screen, speaker, and/or the like), memory, long-term storage (such as magnetic storage, optical storage, and/or the like), and/or network connectivity, according to techniques that are well known in the art. Such an electronic device may be portable or nonportable. Examples of electronic devices that may be used for implementing the described system and method include: a mobile phone, personal digital assistant, smartphone, kiosk, server computer, enterprise computing device, desktop computer, laptop computer, tablet computer, consumer electronic device, or the like. An electronic device may use any operating system such as, for example and without limitation: Linux; Microsoft Windows, available from Microsoft Corporation of Redmond, Washington; MacOS, available from Apple Inc. of Cupertino, California; iOS, available from Apple Inc. of Cupertino, California; Android, available from Google, Inc. of Mountain View, California; and/or any other operating system that is adapted for use on the device.

While a limited number of embodiments have been described herein, those skilled in the art, having benefit of the above description, will appreciate that other embodiments may be devised. In addition, it should be noted that the language used in the specification has been principally selected for readability and instructional purposes, and may not have been selected to delineate or circumscribe the subject matter. Accordingly, the disclosure is intended to be illustrative, but not limiting, of scope.

What is claimed is:

1. A computer-implemented method for selecting a compression algorithm, comprising:
    at a processor, obtaining a cost model that quantifies computing cost for compression operations;
    at the processor, based on the cost model, selecting one of a plurality of compression algorithms;
    at the processor, determining parameters for the selected compression algorithm;
    at an output device, outputting the selected compression algorithm and determined parameters;
    automatically compressing data using the selected compression algorithm and determined parameters;
    automatically monitoring system resource usage during compression;
    and responsive to system resource usage relative to a predetermined threshold, disabling or resuming compression.

2. The method of claim 1, further comprising, prior to selecting one of the plurality of compression algorithms:
    automatically obtaining data for refining the cost model; and
    automatically refining the cost model based on the obtained data.

3. The method of claim 1, wherein determining parameters for the selected compression algorithm comprises automatically determining parameters for the selected compression algorithm based on the cost model.

4. The method of claim 1, further comprising:
    responsive to system resource usage exceeding a predetermined threshold, disabling compression.

5. The method of claim 1, further comprising:
    responsive to system resource usage falling below the predetermined threshold, resuming compression.

6. The method of claim 1, wherein automatically monitoring system resource usage during compression comprises automatically monitoring CPU usage during compression.

7. The method of claim 1, wherein the cost model takes into account at least one selected from the group consisting of:
    a financial cost associated with compression of data;
    a financial cost associated with decompression of data;
    a financial cost associated with storage of compressed data; and
    a financial cost associated with transmission of compressed data.

8. The method of claim 1, wherein the cost model takes into account:
    potential cost of computing at least one new compression dictionary;
    and potential savings in at least one of computing cost and storage cost, resulting from the use of at least one new compression dictionary.

9. The method of claim 1, wherein selecting one of a plurality of compression algorithms comprises taking into account at least one non-financial constraint.

10. A computer-implemented method for selecting a compression algorithm, the method comprising:
    at a processor, obtaining a cost model that quantifies computing cost for compression operations, wherein obtaining the cost model comprises determining the cost model based on compression of sample data under a plurality of settings, statistical analysis, or machine learning;
    at the processor, based on the cost model, selecting one of a plurality of compression algorithms;

at the processor, determining parameters for the selected compression algorithm;

and at an output device, outputting the selected compression algorithm and determined parameters.

11. The method of claim 10, wherein the cost model takes into account:

potential cost of computing at least one new compression dictionary;

and potential savings in at least one of computing cost and storage cost, resulting from the use of at least one new compression dictionary.

12. A computer-implemented method for selecting a compression algorithm, the method comprising:

at a processor, obtaining a cost model that quantifies computing cost for compression operations;

at the processor, based on the cost model, selecting one of a plurality of compression algorithms;

at the processor, determining parameters for the selected compression algorithm;

and at an output device, outputting the selected compression algorithm and determined Parameters, wherein the steps of selecting one of the plurality of compression algorithms and determining parameters for the selected compression algorithm are performed at a virtual appliance running on a communications network, on a system comprising at least two virtual appliances communicating with one another over a communications network, on a system comprising software running on a mobile device and communicating over a communications network with software running on a virtual appliance, or at a device driver.

13. A non-transitory computer-readable medium for selecting a compression algorithm, comprising instructions stored thereon, that when performed by a hardware processor, perform the steps of:

at a processor, obtaining a cost model that quantifies computing cost for compression operations;

at the processor, based on the cost model, selecting one of a plurality of compression algorithms;

at the processor, determining parameters for the selected compression algorithm;

at an output device, outputting the selected compression algorithm and determined parameters;

automatically compressing data using the selected compression algorithm and determined parameters;

automatically monitoring system resource usage during compression;

and responsive to system resource usage relative to a predetermined threshold, disabling or resuming compression.

14. The non-transitory computer-readable medium of claim 13, further comprising instructions stored thereon, that when performed by the hardware processor, perform the steps of, prior to selecting one of the plurality of compression algorithms:

automatically obtaining data for refining the cost model; and automatically refining the cost model based on the obtained data.

15. The non-transitory computer-readable medium of claim 13, wherein determining parameters for the selected compression algorithm comprises automatically determining parameters for the selected compression algorithm base on the cost model.

16. The non-transitory computer-readable medium of claim 13, further comprising instructions stored thereon, that when performed by the hardware processor, perform the steps of:

responsive to system resource usage exceeding a predetermined threshold, disabling compression.

17. The non-transitory computer-readable medium of claim 13, further comprising instructions stored thereon, that when performed by the hardware processor, perform the steps of:

responsive to system resource usage falling below the predetermined threshold, resuming compression.

18. The non-transitory computer-readable medium of claim 13, wherein automatically monitoring system resource usage during compression comprises automatically monitoring CPU usage during compression.

19. The non-transitory computer-readable medium of claim 13, wherein the cost model takes into account at least one selected from the group consisting of:

a financial cost associated with compression of data;

a financial cost associated with decompression of data;

a financial cost associated with storage of compressed data; and a financial cost associated with transmission of compressed data.

20. The non-transitory computer-readable medium of claim 13, wherein the cost model takes into account:

potential cost of computing at least one new compression dictionary; and potential savings in at least one of computing cost and storage cost, resulting from the use of at least one new compression dictionary.

21. The non-transitory computer-readable medium of claim 13, wherein selecting one of a plurality of compression algorithms comprises taking into account at least one non-financial constraint.

22. A non-transitory computer-readable medium for selecting a compression algorithm, comprising instructions stored thereon, that when performed by a hardware processor, perform the steps of:

at a processor, obtaining a cost model that quantifies computing cost for compression operations, wherein obtaining the cost model comprises determining the cost model based on compression of sample data under a plurality of settings, statistical analysis, or machine learning;

at the processor, based on the cost model, selecting one of a plurality of compression algorithms;

at the processor, determining parameters for the selected compression algorithm;

and at an output device, outputting the selected compression algorithm and determined parameters.

23. The non-transitory computer-readable medium of claim 22, wherein the cost model takes into account:

potential cost of computing at least one new compression dictionary;

and potential savings in at least one of computing cost and storage cost, resulting from the use of at least one new compression dictionary.

24. A non-transitory computer-readable medium for selecting a compression algorithm, comprising instructions stored thereon, that when performed by a hardware processor, perform the steps of:

at a processor, obtaining a cost model that quantifies computing cost for compression operations;

at the processor, based on the cost model, selecting one of a plurality of compression algorithms;

at the processor, determining parameters for the selected compression algorithm;

and at an output device, outputting the selected compression algorithm and determined parameters, wherein the steps of selecting one of the plurality of compression algorithms and determining parameters for the selected compression algorithm are performed at a virtual appliance running on a communications network, on a system comprising at least two virtual appliances communicating with one another over a communications network, on a system comprising software running on a mobile device and communicating over a communications network with software running on a virtual appliance, or at a device driver.

25. A system for selecting a compression algorithm, comprising:
a processor, configured to:
obtain a cost model that quantifies computing cost for compression operations;
based on the cost model, select one of a plurality of compression algorithms; and
determine parameters for the selected compression algorithm;
automatically compressing data using the selected compression algorithm and determined Parameters;
automatically monitoring system resource usage during compression; and
responsive to system resource usage relative to a predetermined threshold, disabling or resuming compression; and
an output device, communicatively coupled to the processor, configured to output the selected compression algorithm and determined parameters.

26. The system of claim 25, wherein the processor is further configured to, prior to selecting one of the plurality of compression algorithms:
automatically obtain data for refining the cost model; and
automatically refine the cost model based on the obtained data.

27. The system of claim 25, wherein determining parameters for the selected compression algorithm comprises automatically determining parameters for the selected compression algorithm based on the cost model.

28. The system of claim 25, wherein the processor is further configured to:
responsive to system resource usage exceeding a predetermined threshold, disable compression.

29. The system of claim 25, wherein the processor is further configured to:
responsive to system resource usage falling below the predetermined threshold, resume compression.

30. The system of claim 25, wherein automatically monitoring system resource usage during compression comprises automatically monitoring CPU usage during compression.

31. The system of claim 25, wherein the cost model takes into account at least one selected from the group consisting of:
a financial cost associated with compression of data;
a financial cost associated with decompression of data;
a financial cost associated with storage of compressed data; and
a financial cost associated with transmission of compressed data.

32. The system of claim 25, wherein the cost model takes into account:
potential cost of computing at least one new compression dictionary; and
potential savings in at least one of computing cost and storage cost, resulting from the use of at least one new compression dictionary.

33. The system of claim 25, wherein selecting one of a plurality of compression algorithms comprises taking into account at least one non-financial constraint.

34. A system for selecting a compression algorithm, the system comprising:
a processor, configured to:
obtain a cost model that quantifies computing cost for compression operations, wherein obtaining the cost model comprises determining the cost model based on compression of sample data under a plurality of settings, statistical analysis, or machine learning;
based on the cost model, select one of a plurality of compression algorithms; and
determine parameters for the selected compression algorithm; and
an output device, communicatively coupled to the processor, configured to output the selected compression algorithm and determined parameters.

35. The system of claim 34, wherein the cost model takes into account:
potential cost of computing at least one new compression dictionary;
and potential savings in at least one of computing cost and storage cost, resulting from the use of at least one new compression dictionary.

36. A system for selecting a compression algorithm, the system comprising:
a processor, configured to:
obtain a cost model that quantifies computing cost for compression operations;
based on the cost model, select one of a plurality of compression algorithms; and
determine parameters for the selected compression algorithm, wherein the processor configured to select one of the plurality of compression algorithms and determine parameters for the selected compression algorithm is installed on an architecture comprising at a virtual appliance running on a communications network, on a system comprising at least two virtual appliances communicating with one another over a communications network, on a system comprising software running on a mobile device and communicating over a communications network with software running on a virtual appliance, or at a device driver; and
an output device, communicatively coupled to the processor, configured to output the selected compression algorithm and determined parameters.

\* \* \* \* \*